United States Patent
Liu et al.

(10) Patent No.: US 8,940,197 B2
(45) Date of Patent: Jan. 27, 2015

(54) PROCESSES FOR PRODUCING PALLADIUM NANOPARTICLE INKS

(75) Inventors: Ping Liu, Mississauga (CA); Yiliang Wu, Oakville (CA); Nan-Xing Hu, Oakville (CA); Anthony James Wigglesworth, Oakville (CA)

(73) Assignee: Xerox Corporation, Norwalk, CT (US)

( * ) Notice: Subject to any disclaimer, the term of this patent is extended or adjusted under 35 U.S.C. 154(b) by 235 days.

(21) Appl. No.: 13/404,128

(22) Filed: Feb. 24, 2012

(65) Prior Publication Data
US 2013/0221288 A1    Aug. 29, 2013

(51) Int. Cl.
*H01B 1/02* (2006.01)
*H01B 1/22* (2006.01)

(52) U.S. Cl.
USPC ............. 252/514; 75/343; 75/351; 106/1.21; 106/1.28; 427/123; 427/125; 427/553; 977/773; 977/810

(58) Field of Classification Search
CPC .............. C09D 11/00; B22F 9/00; B22F 9/18
USPC ............. 252/514; 75/343, 351; 427/123, 125, 427/553; 106/1.21, 1.28; 977/773, 810
See application file for complete search history.

(56) References Cited

U.S. PATENT DOCUMENTS

| | | | |
|---|---|---|---|
| 6,878,184 B1 * | 4/2005 | Rockenberger et al. ......... | 75/343 |
| 7,270,694 B2 * | 9/2007 | Li et al. ........................... | 75/351 |
| 7,494,608 B2 * | 2/2009 | Li et al. .......................... | 252/514 |
| 8,568,824 B2 * | 10/2013 | Wu et al. ........................ | 427/125 |
| 2009/0286006 A1 * | 11/2009 | Lin et al. ....................... | 427/553 |
| 2011/0059233 A1 * | 3/2011 | Liu et al. ........................ | 427/123 |

FOREIGN PATENT DOCUMENTS

JP    2008-138243    *    6/2008

* cited by examiner

*Primary Examiner* — Khanh Tuan Nguyen
(74) *Attorney, Agent, or Firm* — Fay Sharpe LLP

(57) ABSTRACT

A process for preparing a palladium nanoparticle ink comprises reacting a reaction mixture comprising a palladium salt, a stabilizer, a reducing agent, and an optional solvent to directly form the palladium nanoparticle ink. During the formation of the palladium nanoparticle ink, the palladium nanoparticles are not isolated from the reaction mixture.

15 Claims, 4 Drawing Sheets
(1 of 4 Drawing Sheet(s) Filed in Color)

PROCESSES FOR PRODUCING PALLADIUM NANOPARTICLE INKS

BACKGROUND

The present disclosure relates to processes for producing palladium nanoparticles and palladium nanoparticle inks. The palladium nanoparticles and inks, as well as methods for producing conductive elements from the palladium nanoparticles, are also disclosed.

Fabrication of electronic circuit elements using liquid deposition techniques may be beneficial as such techniques provide potentially low-cost alternatives to conventional mainstream amorphous silicon technologies for electronic applications such as thin-film transistors (TFTs), light-emitting diodes (LEDs), RFID tags, photovoltaics, etc. However, the deposition and/or patterning of functional electrodes, pixel pads, and conductive traces, lines and tracks which meet the conductivity, processing, and cost requirements for practical applications have been a great challenge. The precious metal palladium (Pd) is of particular interest because palladium has many special properties and a wide range of specific applications in many industries. Like gold, palladium is highly conductive and is widely used in electronic devices, fuel cells, surgical instruments, electrical contacts, etc. Palladium structures are conventionally formed in such devices by electroplating, sputtering, or chemical vapor deposition (CVD).

In order to reduce costs and improve results, it would be desirable to develop efficient methods to prepare palladium nanoparticles. There is a need for solution-processable compositions that can be used for palladium deposition.

BRIEF DESCRIPTION

The present application discloses, in various exemplary embodiments, processes for directly preparing inks comprising palladium nanoparticles. These palladium nanoparticle inks allow for low-cost solution deposition for many industrial applications. Such liquid deposition methods may include spin coating, dip coating, and inkjet printing. Devices which use the palladium nanoparticle inks, such as thin-film transistors, are also disclosed.

Disclosed in various embodiments is a process for preparing a palladium nanoparticle ink, comprising reacting a reaction mixture comprising a palladium salt, a stabilizer, a reducing agent, and an optional solvent to directly form the palladium nanoparticle ink. The direct formation of the palladium nanoparticle ink may occur without isolation of the palladium nanoparticles from the reaction mixture.

The palladium salt may be selected from the group consisting of palladium carboxylate, palladium acetate, palladium chloride, palladium bromide, palladium iodide, palladium nitrate, palladium sulfate, palladium cyanide, (ethylenediamine)palladium chloride, bis(ethylenediamine) palladium chloride, tetraaminepalladium bromide, tetraaminepalladium bromide monohydrate, tetraaminepalladium chloride, tetraaminepalladium chloride monohydrate, bis(acetylacetonato) palladium, and diamine-dinitro-palladium.

The stabilizer may be an organoamine selected from the group consisting of propylamine, butylamine, pentylamine, hexylamine, heptylamine, octylamine, nonylamine, decylamine, undecylamine, dodecylamine, tridecylamine, tetradecylamine, pentadecylamine, hexadecylamine, heptadecylamine, octadecylamine, N,N-dimethylamine, N,N-dipropylamine, N,N-dibutylamine, N,N-dipentylamine, N,N-dihexylamine, N,N-diheptylamine, N,N-dioctylamine, N,N-dinonylamine, N,N-didecylamine, N,N-diundecylamine, N,N-didodecylamine, methylpropylamine, ethylpropylamine, propylbutylamine, ethylbutylamine, ethylpentylamine, propylpentylamine, butylpentylamine, triethylamine, tripropylamine, tributylamine, tripentylamine, trihexylamine, triheptylamine, trioctylamine, 1,2-ethylenediamine, N,N,N',N'-tetramethylethylenediamine, propane-1,3-diamine, N,N,N',N'-tetramethylpropane-1,3-diamine, butane-1,4-diamine, and N,N,N',N'-tetramethylbutane-1,4-diamine, and mixtures thereof.

The solvent may be an alkane having from about 8 to about 18 carbon atoms, an alcohol having from about 8 to about 18 carbon atoms, an isoparrafin hydrocarbon, toluene, mesitylene, xylene ethylbenzene, diethylbenzene, trimethyl benzene, methyl ethylbenzene, tetrahydronaphthalene, mesitylene, ethylbenzene, diethylbenzene, benzene, cyclohexane, decalin, chlorobenzene, dichlorobenzene, trichlorobenzene, nitrobenzene, cyanobenzene, or a mixture thereof.

The reducing agent may be a hydrazine compound, a borane compound, or a mixture of hydrazine and borane compounds.

In certain embodiments, the reducing agent may be a hydrazine compound or derivative having the following formula:

wherein $R^1$, $R^2$, $R^3$ and $R^4$ are independently selected from hydrogen, alkyl, and aryl.

The molar ratio of the stabilizer to the palladium salt in the reaction mixture may be from about 1:1 to about 10:1. The molar ratio of the reducing agent to the palladium salt in the reaction mixture may be from about 1:1 to about 5:1. The palladium salt may be from about 5 to about 80 wt % of the reaction mixture. The reaction mixture may be reacted at a temperature of from about 20° C. to about 70° C. The resulting palladium nanoparticles may be from about 5 to about 80 wt % of the palladium nanoparticle ink.

Also disclosed in embodiments is a process for preparing a palladium nanoparticle ink. An initial mixture comprising a palladium salt, a stabilizer, and an optional solvent is prepared. A reducing agent is then added to the initial mixture to form a reaction mixture. The reaction mixture is mixed to reduce at least a portion of the palladium salt to obtain the palladium nanoparticle ink. Optionally, the ink can be diluted by adding additional solvent.

The stabilizer may be an organoamine. The reducing agent may be an organohydrazine. The solvent may be a hydrocarbon solvent. The molar ratio of the stabilizer to the palladium salt in the reaction mixture may be from about 1:1 to about 10:1. The molar ratio of the reducing agent to the palladium salt in the reaction mixture may be from about 1:1 to about 5:1.

Also disclosed are the palladium nanoparticle inks produced by the processes described above. The average particle size of the nanoparticles may be about 20 nanometers or less.

These and other non-limiting characteristics of the disclosure are more particularly disclosed below.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The following is a brief description of the drawings, which are presented for the purposes of illustrating the exemplary embodiments disclosed herein and not for the purposes of limiting the same.

DETAILED DESCRIPTION

Figure 1:
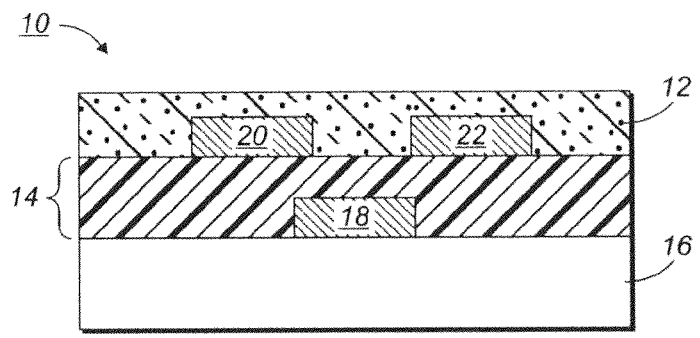
FIG. 1 represents a first embodiment of a thin film transistor containing nanoparticles of the present disclosure.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The term "nano" as used in "palladium nanoparticles" indicates a particle size of less than about 1000 nm. In embodiments, the palladium nanoparticles have a particle size of from about 0.5 nm to about 1000 nm, from about 1 nm to about 500 nm, from about 1 nm to about 100 nm, and particularly from about 1 nm to about 20 nm. The particle size is defined herein as the average diameter of the palladium nanoparticles, as determined by TEM (transmission electron microscopy).

The modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range from about 2 to about 4" also discloses the range "from 2 to 4."

The term "room temperature" refers to a temperature of about 23° C.

The use of the singular terms "a", "an", and "the" should be construed to include plural referents as well, unless clearly indicated otherwise by the context. Put another way, these singular terms should be construed as "at least one".

The present disclosure relates to processes for forming palladium nanoparticles. Generally, a reaction mixture comprising a palladium salt, a stabilizer, a reducing agent, and a solvent is reacted to form the stabilized palladium nanoparticles. The palladium nanoparticles can then be used to form palladium nanoparticle inks for solution deposition.

Exemplary palladium salts which can be used in the reaction mixture include palladium carboxylate, palladium acetate, palladium chloride, palladium bromide, palladium iodide, palladium nitrate, palladium sulfate, palladium cyanide, (ethylenediamine)palladium chloride, bis(ethylenediamine)palladium chloride, tetraaminepalladium bromide, tetraaminepalladium bromide monohydrate, tetraaminepalladium chloride, tetraaminepalladium chloride monohydrate, bis(acetylacetonato) palladium, and diamine-dinitro-palladium. The palladium salt particles are desirably fine in particle size for homogeneous dispersion in the solution, which aids in efficient reaction. In specific embodiments, palladium acetate is used.

It should be noted that the palladium salt is a molecular compound. Pd—Pd bonds may be present in the molecular compound. However, the palladium salt should not be considered to be a nanoparticle or similar material. The palladium atom in the salt is not zero valent, while palladium atoms are zero valent in the nanoparticle form.

The stabilizer has the function of minimizing or preventing the nanoparticles from aggregating, and provides or enhances the solubility or dispersiblity of the resulting nanoparticles in the solvent. The stabilizer may be an organoamine. The organoamine may be a primary, secondary, or tertiary amine. The organoamine can also be a monoamine, diamine, or polyamine. Combinations of more than one organoamine are also contemplated. Exemplary organoamines include propylamine, butylamine, pentylamine, hexylamine, heptylamine, octylamine, nonylamine, decylamine, undecylamine, dodecylamine, tridecylamine, tetradecylamine, pentadecylamine, hexadecylamine, heptadecylamine, octadecylamine, N,N-dimethylamine, N,N-dipropylamine, N,N-dibutylamine, N,N-dipentylamine, N,N-dihexylamine, N,N-diheptylamine, N,N-dioctylamine, N,N-dinonylamine, N,N-didecylamine, N,N-diundecylamine, N,N-didodecylamine, methylpropylamine, ethylpropylamine, propylbutylamine, ethylbutylamine, ethylpentylamine, propylpentylamine, butylpentylamine, triethylamine, tripropylamine, tributylamine, tripentylamine, trihexylamine, triheptylamine, trioctylamine, 1,2-ethylenediamine, N,N,N',N'-tetramethylethylenediamine, propane-1,3-diamine, N,N,N',N'-tetramethylpropane-1,3-diamine, butane-1,4-diamine, and N,N,N',N'-tetramethylbutane-1,4-diamine, and the like, or mixtures thereof.

In more specific embodiments, the organoamine(s) present in the reaction mixture contain at least 6 carbon atoms per amine group. In particular embodiments, the organoamine has only one nitrogen atom (i.e. a mono-organoamine). Exemplary mono-organoamines include primary aliphatic amines, secondary aliphatic amines, and tertiary aliphatic amines, having the formulas $NH_2$—$R^3$, $NHR^4R^5$, and $NR^6R^7R^8$, respectively, wherein $R^3$ is alkyl having from 6 to 18 carbon atoms, especially those where the $R^3$ is a linear alkyl chain; $R^4$ and $R^5$ are independently alkyl having from 3 to about 18 carbon atoms; and $R^6$, $R^7$, and $R^8$ are independently alkyl having from 2 to about 18 carbon atoms.

Examples of mono-organoamines include hexylamine, octylamine, nonylamine, decylamine, undecylamine, dodecylamine, tridecylamine, tetradecylamine, hexadecylamine, dipentylamine, dihexylamine, diheptylamine, dioctylamine, dinonylamine, didecylamine, propylpentylamine, butylpentylamine, tributylamine, and trihexylamine. In specific embodiments, the stabilizer is octylamine, dodecylamine, tridecylamine, tetradecylamine, pentadecylamine, or hexadecylamine.

The stabilizer may also be a carboxylic acid. The carboxylic acid may have from 4 to about 20 carbon atoms. The carboxylic acid can be selected from the group consisting of butyric acid, pentanoic acid, hexanoic acid, heptanoic acid, octanoic acid, nonanoic acid, decanoic acid, undecanoic acid, dodecanoic acid, tridecanoic acid, myristic acid, pentadecanoic acid, palmitic acid, heptadecanoic acid, stearic acid, oleic acid, nonadecanoic acid, icosanoic acid, eicosenoic acid, elaidic acid, linoleic acid, and palmitoleic acid.

Other suitable stabilizers may include, for example, thiol and its derivatives, —OC(=S)SH (xanthic acid), polyethylene glycols, polyvinylpyridine, polyninylpyrolidone, and other organic surfactants. The organic stabilizer may be selected from the group consisting of a thiol such as, for example, butanethiol, pentanethiol, hexanethiol, heptanethiol, octanethiol, decanethiol, and dodecanethiol; a dithiol such as, for example, 1,2-ethanedithiol, 1,3-propanedithiol, and 1,4-butanedithiol; or a mixture of a thiol and a dithiol. The organic stabilizer may be selected from the group consisting of a xanthic acid such as, for example, O-methylxanthate, O-ethylxanthate, O-propylxanthic acid, O-butylxanthic acid, O-pentylxanthic acid, O-hexylxanthic acid, O-heptylxanthic acid, O-octylxanthic acid, O-nonylxanthic acid, O-decylxanthic acid, O-undecylxanthic acid, O-dodecylxanthic acid. Organic stabilizers containing a pyridine derivative (for example, dodecyl pyridine) and/or organophosphine may also be used as a potential stabilizer. The reducing agent may be a hydrazine compound, a borane compound, or a mixture of hydrazine and borane compounds.

In certain embodiments, the reducing agent may be a hydrazine compound and or derivative having the following formula:

wherein $R^1$, $R^2$, $R^3$ and $R^4$ are independently selected from hydrogen, alkyl, and aryl group such as methyl ethyl, propyl, butyl, hydroxyethyl, phenyl, benzyl, tolyl, bromophenyl, chloropehnyl, nitrophenyl, xylyl, and the like. Illustrative examples of hydrazine include for example, methylhydrazine, tert-butylhydrazine, 2-hydroxyethylhydrazine, benzylhydrazine, phenylhydrazine, tolylhydrazine, bromophenylhydrazine, chlorophenylhydrazine, nitrophenylhydrazine, 1,1-dimethylhydrazine, 1,1-diphenylhydrazine, 1,2-diethylhydrazine, and 1,2-diphenylhydrazine. It is understood that a hydrazine compound includes any suitable hydrazine salt, hydrazide and hydrates of hydrazine. Examples of hydrazine salts include hydrazine acid tartrate, hydrazine monohydrobromide, hydrazine monohydrochloride, hydrazine dichloride, hydrazine monooxalate, hydrazine sulfate, methylhydrazine hydrochloride, phenylhydrazine hydrochloride, benzylhydrazine oxalate, butylhydrazine hydrochloride, butylhydrazine oxalate salt, and propylhydrazine oxalate salt. Illustrative examples of hydrazide are, for example, formic hydrazide, acethydrazide, benzhydrazide, adipic acid dihydrazide, carbohydrazide, butanohydrazide, hexanoic hydrazide, octanoic hydrazide, oxamic acid hydrazide, maleic hydrazide, N-methyl hydrazinecarboxamide, semicarbazide, methanesulfonohydrazide, benzenesulfonohydrazine, 2,4,6-trimethylbenzenesulfonohydrazide, and p-toluenesulfonohydrazide.

In some embodiments, the hydrazine compound is an organohydrazine, i.e. wherein at least one of $R^1$, $R^2$, $R^3$ and $R^4$ is not hydrogen. In more specific embodiments, the hydrazine compound is of the formula $R^1R^2N$—$NH_2$, where at least one of $R^1$ and $R^2$ is not hydrogen.

In embodiments, the reducing agent includes a borane reagent. Examples of borane reagent includes methylamine-borane, dimethylamine borane, diethylamine-borane, diethylmethylamine-borane, ethylenediamine-borane, triethylenediamine-borane, dimethylsulfide borane, tetrahydrofuran-borane.

One, two, three or more reducing agents may be used. In embodiments where two or more reducing agents are used, each reducing agent may be present at any suitable weight ratio or molar ratio such as for example from about 99(first reducing agent):1(second reducing agent) to about 1(first reducing agent):99(second reducing agent). In some embodiments, the amount of reducing agent is about 0.25 molar equivalent or more per mole of palladium compound.

The solvent may be an alkane having from about 8 to about 18 carbon atoms, an alcohol having from about 8 to about 18 carbon atoms, an isoparaffin hydrocarbon, toluene, mesitylene, xylene ethylbenzene, diethylbenzene, trimethyl benzene, methyl ethylbenzene, tetrahydronaphthalene, mesitylene, ethylbenzene, diethylbenzene, benzene, cyclohexane, decalin, chlorobenzene, dichlorobenzene, trichlorobenzene, nitrobenzene, cyanobenzene; or a mixture thereof.

The solvent should facilitate the dispersion of the stabilized metal nanoparticles. Examples of the solvent may include, for example, an alkane or an alcohol having from about 8 to about 18 carbon atoms or from about 10 to about 14 carbon atoms, such as, heptanes, undecane, dodecane, tridecane, tetradecane, 1-undecanol, 2-undecanol, 3-undecanol, 4-undecanol, 5-undecanol, 6-undecanol, 1-dodecanol, 2-dodecanol, 3-dodecanol, 4-dodecanol, 5-dodecanol, 6-dodecanol, 1-tridecanol, 2-tridecanol, 3-tridecanol, 4-tridecanol, 5-tridecanol, 6-tridecanol, 7-tridecanol, 1-tetradecanol, 2-tetradecanol, 3-tetradecanol, 4-tetradecanol, 5-tetradecanol, 6-tetradecanol, 7-tetradecanol, and the like; a monoterpene alcohol, such as for example, terpineol (a-terpineol), β-terpineol, γ-terpineol, 4-terpineol, and the like; isoparaffin hydrocarbons, such as, for example, isodecane, isododecane, and commercially available mixtures of isoparaffins such as ISOPAR E, ISOPAR G, ISOPAR H, ISOPAR L and ISOPAR M (all the above-mentioned manufactured by Exxon Chemical Company), SHELLSOL (made by Shell Chemical Company), SOLTROL (made by Philips Oil Co., Ltd.); toluene, mesitylene, xylene ethylbenzene, diethylbenzene, trimethyl benzene, methyl ethylbenzene, tetrahydronaphthalene, mesitylene, ethylbenzene, diethylbenzene, benzene, cyclohexane, decalin, chlorobenzene, dichlorobenzene, trichlorobenzene, nitrobenzene, cyanobenzene, and mixtures thereof.

In embodiments where two or more solvents are used, each solvent may be present at any suitable volume ratio such as for example from about 99(first solvent):1(second solvent) to about 1(first solvent):99(second solvent), from about 80 (first solvent):20 (second solvent) to about 20(first solvent):80 (second solvent).

The solvent in the reaction mixture may be any suitable solvent in which the other ingredients (palladium salt, stabilizer, reducing agent) can dissolve or be dispersed. In embodiments, the solvent has a polarity index of 3.0 or less and may be a hydrocarbon, a heteroatom-containing aromatic compound, an alcohol, and the like. Not all hydrocarbons, heteroatom-containing aromatic compounds, and alcohols necessarily have a polarity index of 3.0 or less. Exemplary heteroatom-containing aromatic compounds include bromobenzene, chlorobenzene, chlorotoluene, dichlorobenzene, and nitrotoluene. In embodiments, the solvent is a hydrocarbon solvent containing about 6 carbon atoms to about 28 carbon atoms, such as an aromatic hydrocarbon containing from about 7 to about 18 carbon atoms, a linear or a branched aliphatic hydrocarbon containing from about 8 to about 28 carbon atoms, or a cyclic aliphatic hydrocarbon containing from about 6 to about 28 carbon atoms. Exemplary hydrocarbons include toluene, heptane, hexane, benzene, cyclohexane, and pentane. In other embodiments, the solvent can be a monocyclic or a polycyclic hydrocarbon. Monocyclic solvents include a cyclic terpene, a cyclic terpinene, and a substituted cyclohexane. Polycyclic solvents include compounds having separate ring systems, combined ring systems, fused ring systems, and bridged ring systems. In embodiments, the polycyclic solvent includes bicyclopropyl, bicyclopentyl, bicyclohexyl, cyclopentylcyclohexane, spiro[2,2]heptane, spiro[2,3]hexane, spiro[2,4]heptane, spiro[3,3]heptane, spiro [3,4]octane, bicyclo[4,2,0]octanehydroindane, decahydronaphthalene(bicyclo[4.4.0]decane or decalin), perhydrophenanthroline, perhydroanthracene, norpinane, norbornane, bicyclo[2,2,1]octane and so on. Other exemplary solvents may include, but are not limited to, hexane, dodecane, tetradecane, hexadecane, octadecane, an isoparaffinic hydrocarbon, toluene, xylene, mesitylene, diethylbenzene, trimethylbenzene, tetraline, hexalin, decalin, a cyclic terpene, cyclodecene, 1-phenyl-1-cyclohexene, 1-tert-butyl-1-cyclohexene, methyl naphthalene and mixtures thereof. The term "cyclic terpene" includes monocyclic monoterpenes such as limonene, selinene, terpinolene, and terpineol; bicyclic monoterpenes such as α-pinene; and cyclic terpinenes such as γ-terpinene and α-terpinene. The term "isoparaffinic hydrocarbon" refers to a branched chain alkane. Exemplary alcohols include terpineols such as alpha-terpineol, beta-terpineol, gamma-terpineol, and mixtures thereof.

In specific embodiments, the solvent used in the reaction mixture is a hydrocarbon solvent. In some embodiments, another organic solvent with a polarity index of 3.5 or higher can be included. Exemplary such solvents include alcohols such as methanol, ethanol, n-propanol, isopropanol, n-butanol, and isobutanol; glycols, acetone, methyl ethyl ketone (MEK), ethyl acetate, tetrahydrofuran (THF), dimethylformamide (DMF), dimethyl sulfoxide (DMSO), acetic acid, acetonitrile, dioxane, and mixtures thereof.

In particular embodiments, the reaction mixture should not contain any water. In other words, the reaction mixture is substantially free of water. However, it should be noted that these phrases do not require an absolute absence of water. Some residual water may be present in the precursor composition from the various ingredients or from ambient/atmospheric conditions. For example, octylamine is typically liquid with a specification of maximum 0.1 wt % water content, or tributylamine is typically sold with a specification of maximum 0.3 wt % water content. These amounts of water should be considered to be residual and reaction mixtures containing such amounts of water should be considered substantially free of water.

The palladium salt typically makes up from about 5 to about 80 weight percent (wt %) of the reaction mixture. In more specific embodiments, the palladium salt makes up from about 10 wt % to about 50 wt % of the reaction mixture.

In embodiments, the molar ratio of the stabilizer to the palladium salt is from about 1:1 to about 10:1. In more specific embodiments, the molar ratio of stabilizer to palladium salt is from about 1:1 to about 5:1, or from about 2:1 to about 5:1, or from about 2:1 to about 3:1. In some embodiments, the molar ratio of the stabilizer to the palladium salt is at least 2:1.

If desired, the reaction mixture can further include another metal species, for example silver (Ag), gold (Au), copper (Cu), nickel (Ni), rhodium (Rh), cobalt (Co), zinc (Zn), platinum (Pt), and the like. The other metal species may be introduced as another starting ingredient, for example in the form of a metal salt. For example, silver acetate can be used in combination with palladium acetate to form a Ag—Pd alloy.

The additional metal salt in the composition can be present in an amount of, for example, from about 0.1 wt % to about 40 wt %, including from about 1 wt % to about 20 wt % of the precursor composition. However, the additional metal salt should be less than the amount of the palladium salt.

In embodiments, the molar ratio of the reducing agent to the palladium salt is from about 1:1 to about 5:1. In more specific embodiments, the molar ratio of reducing agent to palladium salt is from about 1:1 to about 4:1, or from about 2:1 to about 4:1, or from about 2:1 to about 3:1.

In embodiments, a starting mixture may be formed from the palladium salt, stabilizer, and solvent prior to adding the reducing agent. The starting mixture can be agitated to obtain homogeneity before adding the reducing agent. The reducing agent is then added to form the reaction mixture.

The reaction mixture is then reacted by heating the reaction mixture to a first elevated temperature for a first time period. The first elevated temperature is greater than the starting temperature of room temperature. In embodiments, the first elevated temperature is from about 20° C. to about 70° C., including at a temperature of about 40° C. The first time period may be from about 30 minutes to about 24 hours.

The heating of the reaction mixture does not have to be at a steady temperature for the entire reaction. For example, the heating may constitute a heating at a first elevated temperature for a first time period, a heating at a second elevated temperature for a second time period, and a heating at a third elevated temperature for a third time period.

The second elevated temperature is greater than room temperature, but not necessarily greater than the first elevated temperature. The second elevated temperature may be from about 30° C. to about 65° C. The second time period may be from about 30 minutes to about 24 hours.

The third elevated temperature is greater than room temperature, but not necessarily greater than the first elevated temperature or the second elevated temperature. The third elevated temperature may be from about 30° C. to about 65° C. The third time period may be from about 30 minutes to about 24 hours.

In particular embodiments, the second elevated temperature is less than the first elevated temperature, and the third elevated temperature is greater than the second elevated temperature. In particular embodiments, the second time period is longer than the first time period, and the third time period is shorter than the second time period.

Palladium nanoparticles are thus formed from the reaction mixture. The resulting palladium nanoparticles are composed of elemental palladium or a palladium composite, depending on whether another metal species was added. Thus, besides palladium, the palladium composite may include either or both of (i) one or more other metals and (ii) one or more non-metals. Suitable other metals include, for example, Ag, Al, Au, Pt, Cu, Co, Cr, In, and Ni, particularly the transition metals, for example, Ag, Au, Pt, Cu, Cr, Ni, and mixtures thereof. An exemplary metal composite is Au—Ag—Pd. Suitable non-metals in the metal composite include, for example, Si, C, and Ge. The various components of the palladium composite may be present in an amount ranging for example from about 0.01% to about 99.9% by weight, particularly from about 10% to about 90% by weight. In embodiments, the palladium composite is a metal alloy composed of palladium and one, two or more other metals, with palladium comprising, for example, at least 50% of the nanoparticles by weight, including from about 50% to about 95%, preferably from about 60% to about 95% by weight, or from about 70% to about 95% by weight. Thus, the first mixture may also contain other metal salts needed to form the palladium composite, if desired.

The particle size of the palladium nanoparticles is determined by the average diameter of the particles. The palladium nanoparticles may have an average diameter of about 100 nanometers or less, preferably 20 nanometers or less. In some specific embodiments, the nanoparticles have an average diameter of from about 1 nanometer to about 15 nanometers, including from about 3 nanometers to about 10 nanometers. In addition, the palladium nanoparticles have a very uniform particle size with a narrow particle size distribution. The particle size distribution can be quantified using the standard deviation of the average particle size. In embodiments, the palladium nanoparticles have a narrow particle size distribution with an average particle size standard deviation of 10 nm or less or 3 nm or less, including 2.5 nm or less. In some embodiments, the palladium nanoparticles have an average particle size of from about 1 nanometer to about 10 nanometers with a standard deviation of from about 1 nanometer to about 3 nanometers. Without being limited by theory, it is believed that small particle sizes with a narrow particle size distribution make the nanoparticles easier to disperse when placed in a solvent, and can offer a more uniform coating on the object due to the self-assembly of the uniform palladium nanoparticles.

After reacting or heating the reaction mixture, the reaction mixture is returned to ambient (i.e. room temperature). After reaction, the reaction mixture should have a dark color, indicating formation of palladium nanoparticles. This combination of solvent and palladium nanoparticles formed after reaction can be considered a palladium nanoparticle ink. If desired, additional solvent can be added to the palladium nanoparticle ink. The palladium nanoparticle ink is compatible with a liquid deposition technique (e.g., for fabricating an electronic device). In embodiments, the palladium nanoparticle ink contains from about 5 weight percent to about 80 weight percent (wt %) of the palladium nanoparticles, including from about 5 weight percent to about 60 weight percent of the palladium nanoparticle, or from about 8 wt % to about 40 wt %, or from about 10 wt % to about 20 wt %. Please note that the palladium nanoparticles are not isolated or separated from the reaction mixture.

The palladium nanoparticle ink can be filtered, for example with a syringe filter. The syringe filter may be a 25 mm syringe filter with a 1 µm glass fiber membrane.

Desirably, the solvent used in the palladium nanoparticle ink is a low surface tension solvent. In this regard, surface tension can be measured in units of force per unit length (newtons per meter), energy per unit area (joules/square meter), or the contact angle between the solvent and a glass surface. A low surface tension solvent has a surface tension of less than 35 mN/m, including less than 33 mN/m, less than 30 mN/m, or less than 28 mN/m. In specific embodiments, the solvent used in the palladium nanoparticle ink is decalin, dodecane, tetradecane, hexadecane, bicyclohexane, toluene, an isoparaffinic hydrocarbon, or the like.

In embodiments, the liquid palladium nanoparticle ink comprising the palladium nanoparticles has a low surface tension, for example, less than 32 mN/m, including less than 30 mN/m, or less than 28 mN/m, or less than 25 mN/m. In specific embodiments, the liquid composition has a surface tension from about 22 mN/m to about 28 mN/m, including from about 22 mN/m to about 25 mN/m. The low surface tension can be achieved by using palladium nanoparticles with a low polarity surface, by dissolving/dispersing palladium nanoparticles in a low surface tension solvent, or by adding a low surface tension additive such as a leveling agent, or combinations thereof.

Some low surface tension additives can be added into the palladium nanoparticle ink to lower its surface tension for uniform coating. In some embodiments, the low surface tension additive is a modified polysiloxane. The modified polysiloxane may be a polyether modified acrylic functional polysiloxane, a polyether-polyester modified hydroxyl functional polysiloxane, or a polyacrylate modified hydroxyl functional polysiloxane. Exemplary low surface tension additives include SILCLEAN additives available from BYK. BYK-SILCLEAN 3700 is a hydroxyl-functional silicone modified polyacrylate in a methoxypropylacetate solvent. BYK-SILCLEAN 3710 is a polyether modified acryl functional polydimethylsiloxane. BYK-SILCLEAN 3720 is a polyether modified hydroxyl functional polydimethylsiloxane in a methoxypropanol solvent. In other embodiments, the low surface tension additive is a fluorocarbon modified polymer, a small molecular fluorocarbon compound, a polymeric fluorocarbon compound, and the like. Exemplary fluorocarbon modified molecular or polymeric additives include a fluoroalkylcarboxylic acid, Efka®-3277, Efka®-3600, Efka®-3777, AFCONA-3037, AFCONA-3772, AFCONA-3777, AFCONA-3700, and the like. In other embodiments, the low surface tension additive is an acrylate copolymer. Exemplary acrylate polymer or copolymer additives include Disparlon® additives from King Industries such as Disparlon® L-1984, Disparlon® LAP-10, Disparlon® LAP-20, and the like. The amount of the low surface tension additive may be from about 0.0001 wt % to about 3 wt %, including from about 0.001 wt % to about 1 wt %, or from about 0.001 wt % to about 0.5 wt %.

One advantage of the processes of the present disclosure for making the palladium nanoparticle inks is that the ink is directly formulated at the end of the nanoparticle formation reaction. Palladium nanoparticle powders are flammable in air, and this can cause safety issues. Because the palladium nanoparticles are not isolated from the reaction mixture, such safety issues are not present here.

It should be noted that palladium is sometimes used as a catalyst in organic synthesis. This differs from the reaction mixtures and the palladium nanoparticle inks of the present disclosure in several aspects. First, the palladium in a synthesis reaction functions as a catalyst, while the palladium in the reaction mixture and the ink provide a metal source for a palladium layer, and does not act as a catalyst. Second, the organoamine in a synthesis reaction functions as a reactant, while the organoamine in the reaction mixture and the ink functions as a stabilizer and/or solvent. Third, palladium is used in a catalytic amount in those synthesis reactions, while the palladium salt is merely one of the dominant components of the reaction mixture. In general, here the reaction mixture and the ink are non-catalytic. The term "non-catalytic" refers to the fact that the palladium in the reaction mixture and the ink do not function as a catalyst.

The palladium nanoparticle inks of the present disclosure can be used to apply a palladium coating or layer onto any substrate or object via solution deposition. The palladium nanoparticle ink can be solution deposited upon the substrate. "Solution depositing" and "solution processing" refer to a process where a liquid is deposited upon the substrate to form a structure. This is in contrast to vacuum depositing processes. The present processes for forming a palladium structure are also different from other solution-based processes, for example electroplating, which requires a plate to remain immersed in a solution and also requires exposure to an electric current to form a metal coating on the plate. The present processes also offer several advantages compared to electroless plating. In electroless plating, the deposition of the palladium is slow, so that the overall plating process takes much longer than the solution deposition processes of the present disclosure. Electroless plating also generates a great deal of waste due to residual metal present in the solution. Electroless plating baths or solutions also often contain a reducing agent. In addition, the present processes allow for fine control of where the palladium is deposited for example by inkjet printing. In other words, it is easy to deposit the palladium nanoparticle ink in a discrete location to form a desired pattern or structure using the present processes. In contrast, metal deposition in electroless plating occurs over all surfaces which are immersed in the solution. Masking surfaces which are not to be plated is a complex and time-consuming procedure. However, the present processes can be used in combination with electroplating or electroless plating if needed. For example, the palladium layer formed using the present processes can be used as the base layer for electroplating. Electroless plating palladium or other metals such as copper can be further performed on top of the palladium layer formed with the present processes, for example to increase the thickness of a conductive layer, since palladium is a good seeding layer for electroless plating.

Exemplary solution deposition processes include dip coating, spin coating, spray coating, flexographic printing, offset printing, or inkjet printing (where the palladium nanoparticle ink is ejected onto the substrate by an inkjet printhead). Certain processes involve solution depositing the substrate with the palladium nanoparticle ink to form a structure or film on the substrate. In embodiments, the structure or film has a thickness of from about 10 nanometers to about 50 micrometers, including from about 10 nm to about 30 micrometers, or from about 50 nm to about 5 micrometers, or from about 80 nm to about 1 micrometer.

For example, conductive elements can be fabricated from the palladium nanoparticle inks. The deposited palladium nanoparticles at this stage may or may not exhibit electrical conductivity.

The palladium nanoparticle ink which was previously deposited is then heated (i.e. annealed) to form a conductive palladium layer on the substrate. The heating may be performed at a temperature of from about 80° C. to about 350° C. In other embodiments, the heating is performed at a temperature of above 100° C., or from about 120° C. to about 300° C., or from about 180° C. to about 250° C., or a temperature below 200° C., or a temperature below 150° C. Regardless of the substrate used, the heating temperature is desirably one that does not cause adverse changes in the properties of any previously deposited layer(s) or the substrate (whether a single layer substrate or multilayer substrate). The heating may be performed for a period of up to 30 minutes, and could be for a period as short as 5 seconds depending on the size of the palladium layer and the heating method. The heating can also be performed under normal atmospheric pressure or at a reduced pressure of, for example, from about 1000 millibars to about 0.01 millibars. Examples of heating techniques may include thermal heating (for example, a hot plate, an oven, and a burner), infra-red ("IR") radiation, a laser beam, flash light, microwave radiation, or UV radiation, or a combination thereof.

The deposition processes described herein can be repeated to build up a thicker palladium layer on the object. For example, multiple solution deposition steps may be performed, with one subsequent heating to form the final layer. Alternatively, the steps of solution deposition and heating can be repeated multiple times to build a thick layer out of several thinner layers.

The resulting palladium layer may be electrically conductive. The conductivity of the palladium layer may be, for example, more than about 100 Siemens/centimeter ("S/cm"), more than about 1000 S/cm, more than about 2,000 S/cm, more than about 5,000 S/cm, or more than about 10,000 S/cm or ore than 50,000 S/cm.

The resulting conductive elements can be used as conductive electrodes, conductive pads, conductive lines, conductive tracks, and the like in electronic devices such as thin-film transistors, organic light emitting diodes, RFID (radio frequency identification) tags, photovoltaic devices, and other electronic devices which require conductive elements or components. In some embodiments, the conductive elements are used in thin-film transistors.

FIGS. 1-4 illustrate some different configurations of thin film transistors. The palladium nanoparticle inks could be used, for example, to form any of the electrodes (gate, source, drain) in the transistor.

In FIG. 1, there is schematically illustrated a thin film transistor ("TFT") configuration 10 comprised of a heavily n-doped silicon wafer 18 which acts as both a substrate and a gate electrode, a thermally grown silicon oxide insulating dielectric layer 14 on top of which are deposited two metal contacts, source electrode 20 and drain electrode 22. Over and between the metal contacts 20 and 22 is a semiconductor layer 12 as illustrated herein.

Figure 2:
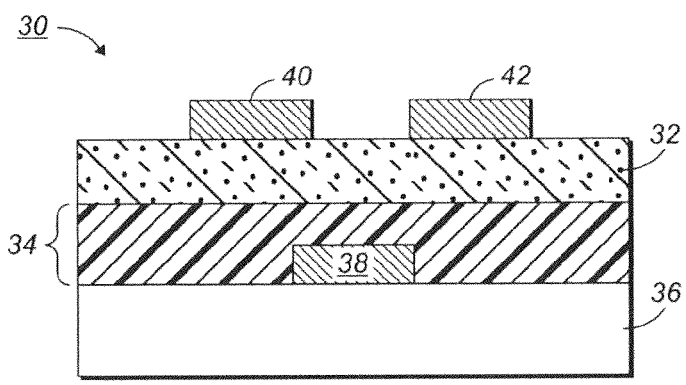
FIG. 2 represents a second embodiment of a thin film transistor containing nanoparticles of the present disclosure.

FIG. 2 schematically illustrates another TFT configuration 30 comprised of a substrate 36, a gate electrode 38, a source electrode 40 and a drain electrode 42, an insulating dielectric layer 34, and a semiconductor layer 32.

Figure 3:
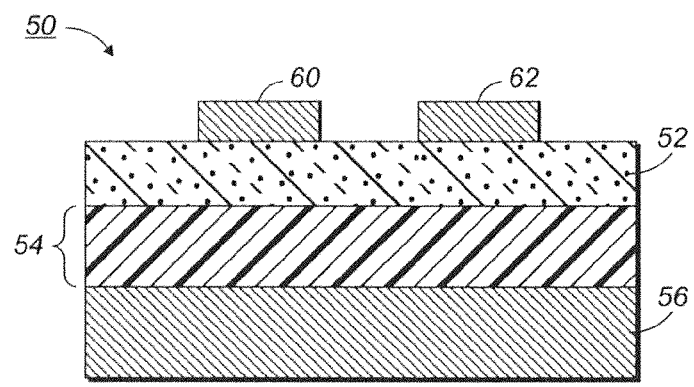
FIG. 3 represents a third embodiment of a thin film transistor containing nanoparticles of the present disclosure.

FIG. 3 schematically illustrates a further TFT configuration 50 comprised of a heavily n-doped silicon wafer 56 which acts as both a substrate and a gate electrode, a thermally grown silicon oxide insulating dielectric layer 54, and a semiconductor layer 52, on top of which are deposited a source electrode 60 and a drain electrode 62.

Figure 4:
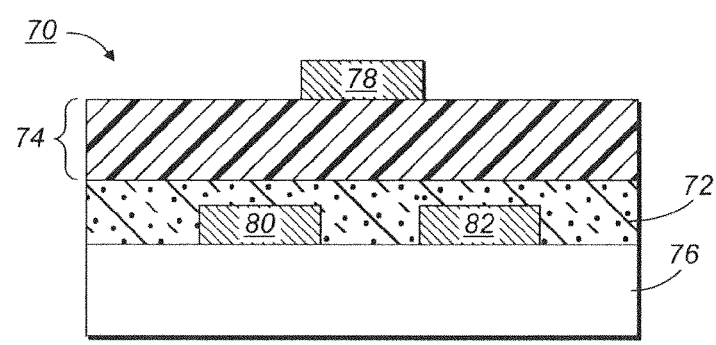
FIG. 4 represents a fourth embodiment of a thin film transistor containing nanoparticles of the present disclosure.

FIG. 4 schematically illustrates an additional TFT configuration 70 comprised of substrate 76, a gate electrode 78, a source electrode 80, a drain electrode 82, a semiconductor layer 72, and an insulating dielectric layer 74.

A thin film transistor generally includes a substrate, a dielectric layer, and a semiconducting layer in addition to the source electrode, drain electrode, and optional gate electrode.

The substrate may be composed of materials including but not limited to silicon, glass plate, plastic film or sheet, and various metals. For structurally flexible devices, plastic substrate, such as for example polyester, polycarbonate, polyimide sheets and the like may be preferred. The thickness of the substrate may be from about 10 micrometers to over 10 millimeters with an exemplary thickness being from about 50 to about 100 micrometers, especially for a flexible plastic substrate and from about 0.5 to about 10 millimeters for a rigid substrate such as glass or silicon.

The dielectric layer generally can be an inorganic material film, an organic polymer film, or an organic-inorganic composite film. Examples of inorganic materials suitable as the dielectric layer include silicon oxide, silicon nitride, aluminum oxide, barium titanate, barium zirconium titanate and the like. Examples of suitable organic polymers include polyesters, polycarbonates, poly(vinyl phenol), polyimides, polystyrene, polymethacrylates, polyacrylates, epoxy resin and the like. The thickness of the dielectric layer depends on the dielectric constant of the material used and can be, for example, from about 10 nanometers to about 500 nanometers.

The dielectric layer may have a conductivity that is, for example, less than about $10^{-12}$ Siemens per centimeter (S/cm). The dielectric layer is formed using conventional processes known in the art, including those processes described in forming the gate electrode.

The dielectric layer may be surface modified with a surface modifier. Exemplary surface modifiers include organosilanes such as hexamethyldisilazane (HMDS), octyltrichlorosilane (OTS-8), octadecyltrichlorosilane (ODTS-18), and phenyltrichlorosilane (PTS). The semiconducting layer can be directly contacted with this modified dielectric layer surface. The contact may be complete or partial. This surface modification can also be considered as forming an interfacial layer between the dielectric layer and the semiconducting layer.

The semiconducting layer generally is made from an organic semiconducting material. Examples of organic semiconductors include but are not limited to acenes, such as anthracene, tetracene, pentacene, and substituted pentacenes, perylenes, fullerenes, oligothiophenes, polythiophenes and their substituted derivatives, polypyrrole, poly-p-phenylenes, poly-p-phenylvinylidenes, naphthalenedicarboxylic dianhydrides, naphthalene-bisimides, polynaphthalenes, phthalocyanines such as copper phthalocyanines or zinc phthalocyanines and their substituted derivatives. The semiconductor may also be an inorganic semiconductor such as ZnO, ZnS, silicon nanowires, and the like.

In specific embodiments, the semiconductors are polythiophenes. Polythiophenes include, for example, regioregular and regiorandom poly(3-alkylthiophene)s, polythiophenes comprising substituted and unsubstituted thienylene groups, polythiophenes comprising optionally substituted thieno[3,2-b]thiophene and/or optionally substituted thieno[2,3-b]thiophene groups, polythiophenes comprising fused-ring aromatic groups, polythiophenes comprising heteroatom-containing fused-ring aromatic groups, and polythiophenes comprising non-thiophene based aromatic groups such as phenylene, fluorene, furan, and the like.

The semiconducting layer is from about 5 nanometers to about 1000 nanometers deep, including from about 20 to about 100 nanometers in depth. In certain configurations, such as the configurations shown in FIG. 1 and FIG. 4, the semiconducting layer completely covers the source and drain electrodes. The semiconducting layer has a channel length defined by the distance between the source and drain electrodes.

The semiconducting layer can be formed by molecular beam deposition, vacuum evaporation, sublimation, spin-on coating, dip coating, printing (e.g., inkjet printing, screen printing, stencil printing, microcontact printing, flexographic printing), and other conventional processes known in the art, including those processes described in forming the gate electrode.

Regarding electrical performance characteristics, the organic semiconductor usually has a conductivity in the range of $10^{-8}$ to $10^{-4}$ S/cm. Various dopants known in the art may also be added to change the conductivity. The organic semiconductor can be either a p-type or n-type semiconductor. For p-type, the semiconductor usually has an energy level (HOMO level) of higher than 4.5 eV. In specific embodiments, the p-type semiconductor has a HOMO level of about 5.1 eV. For n-type, the semiconductor usually has a energy level (LUMO level) of lower than 4.5 eV. In specific embodiments, the n-type semiconductor has a LUMO level of about 4.0 eV. In specific embodiments, the semiconductor is a p-type semiconductor. In specific embodiments, the organic semiconductor is a polythiophene. Polythiophenes generally have a HOMO level of from about 4.7 eV to about 5.5 eV.

The source, drain, and optional gate electrodes may be made from other electrically conductive materials as well. They can be for example, a thin metal film, a conducting polymer film, a conducting film made from conducting ink or paste, or in the case of the gate electrode the substrate itself, for example heavily doped silicon. Other examples of electrode materials include but are not restricted to aluminum, gold, silver, chromium, zinc, indium, conductive metal oxides such as zinc-gallium oxide, indium tin oxide, indium-antimony oxide, conductive polymers such as polystyrene sulfonate-doped poly(3,4-ethylenedioxythiophene) (PSS-PEDOT), and conducting ink/paste comprised of carbon black/graphite. The electrodes can be prepared by vacuum evaporation, sputtering of metals or conductive metal oxides, conventional lithography and etching, chemical vapor deposition, spin coating, casting or printing, or other deposition processes. The thickness of the gate electrode ranges for example from about 10 to about 200 nanometers for metal films and from about 1 to about 10 micrometers for conductive polymers. Typical thicknesses of source and drain electrodes are, for example, from about 40 nanometers to about 1 micrometer, including more specific thicknesses of from about 100 to about 400 nanometers.

If desired, a barrier layer may also be deposited on top of the TFT to protect it from environmental conditions, such as light, oxygen and moisture, etc. which can degrade its electrical properties. Such barrier layers are known in the art and may simply consist of polymers.

The various components of the TFT may be deposited upon the substrate in any order. Generally, however, the gate electrode and the semiconducting layer should both be in contact with the gate dielectric layer. In addition, the source and drain electrodes should both be in contact with the semiconducting layer. The phrase "in any order" includes sequential and simultaneous formation. For example, the source electrode and the drain electrode can be formed simultaneously or sequentially. The term "on" or "upon" the substrate refers to the various layers and components with reference to the substrate as being the bottom or support for the layers and components which are on top of it. In other words, all of the components are on the substrate, even though they do not all directly contact the substrate. For example, both the dielectric layer and the semiconducting layer are on the substrate, even though one layer is closer to the substrate than the other layer.

The present disclosure also relates to methods of coating an object with a palladium cladding. Generally, the object is drawn through the palladium nanoparticle ink (which has a low surface tension). The coating of palladium nanoparticles formed on the object is then annealed to form a cladding on the object. Generally, the object can be flexible, or in other words can be bent without breaking. The object may have any shape. Exemplary objects here include wires, fibers, and filaments, thin sheets, webs, and other similar items.

Specifically contemplated are wires. A wire generally has a small cross-section relative to its length; the ratio of the cross-section to the length is 2 or less, including 1 or less, or 0.1 or less, or 0.001 or less. However, any wire can be coated with the palladium nanoparticle ink, regardless of the diameter, shape, or length of the wire. Both organic materials (e.g. plastic) and inorganic materials (e.g. copper) can be used as the substrate for the wire. The wire may be bare (i.e. uncovered with other layers) or may be insulated by the addition of other layers around a core. The wire may be single-stranded (i.e. solid), multiple stranded, and/or twisted. Exemplary inorganic materials include metals such as copper, aluminum, tungsten, zinc oxide, silicon, and the like. Exemplary plastic wires include wires made from polyimide, polyester, polyamide (Nylor), polycarbonate, polyethylene, polyacrylate, and the like.

Optionally, a receiving layer can be applied prior to drawing the object (e.g. wire) through the palladium nanoparticle ink. The receiving layer may enhance the adhesion of the ink on the object. Any suitable receiving layer can be used. Exemplary receiving layers can be formed from, for example, a silane, especially a silane comprising an amino group.

After drawing the object through the ink, the coating is heated to anneal the palladium nanoparticles. This annealing causes the palladium nanoparticles to coalesce to form a solid cladding of pure palladium. In embodiments, the coating of palladium nanoparticles is annealed at a low temperature of 250° C. or less, including 200° C. or less, or 180° C. or less, for example from about 180° C. to about 250° C. Regardless of the substrate used, the heating temperature is desirably one that does not cause adverse changes in the properties of any previously deposited layer(s) or the substrate (whether a single layer substrate or multilayer substrate). The annealing can be performed for a time ranging from for example about 0.001 minute to about 10 hours, particularly from about 0.01 minute to about 60 minutes, or from about 5 minutes to about 35 minutes, including about 10 minutes. The annealing can be performed in air, in an inert atmosphere (for example, under nitrogen or argon), or in a reducing atmosphere (for example, under nitrogen containing from 1 to about 20 percent by volume hydrogen). The heating can also be performed under normal atmospheric pressure or at a reduced pressure of, for example, from about 1000 mbars to about 0.01 mbars. The term "heating" encompasses any technique that can impart sufficient energy to (1) anneal the metal nanoparticles and/or (2) remove the stabilizer from the metal nanoparticles. Examples of heating techniques may include thermal heating (for example, a hot plate, an oven, and a burner), infra-red ("IR") radiation, a laser beam, flash light, microwave radiation, or UV radiation, or a combination thereof.

As previously noted, palladium has several attractive properties including high conductivity, stability in ambient air, high density, anti-microbial activity, etc. Wires having a palladium cladding can be used in several applications that take advantage of these properties, such as medical devices, electronics wiring, and other consumer products. For example, palladium-clad copper wire could be used to replace solid palladium wires in electronic switches and connectors requiring high conductivity and low contact resistance. The palladium cladding can also be used to increase the weight of the object so that the palladium-clad object has a dramatically different acoustic effect due to the density difference. The palladium cladding also offers a more aesthetic visual appearance or optical effect. This simple solution coating process is also cheaper and easier to operate from a manufacturing viewpoint, which is an advantage compared to conventional plating processes.

If desired, additional layers can be applied on top of the palladium layer (the additional layers may be referred to as overcoat layers). Any layer known in the art may be applied, particularly materials with good scratch resistance. In embodiments, materials that can be used to form an overcoat layer include an epoxy resin, a polyurethane, a phenol resin, a melamine resin, a polysiloxane, a poly(silsesquioxane), and the like. Polysiloxane and poly(silsesquioxane) precursors (for example sol-gel approach) can be used to from a highly crosslinked polysiloxane or poly(silsesquioxane) overcoat layer. In some specific embodiments, the overcoat layer is a crosslinked polysiloxane, a crosslinked poly(silsesquioxane), or a crosslinked layer comprising poly(vinylphenol) and a melamine-formaldehyde resin. The thickness of the overcoat layer may be for example from about 10 nm to about 10 micrometers, including from about 10 nm to about 5 micrometers, or from about 50 nm to about 1 micrometer. In embodiments, the overcoat layer is transparent to visible light. In other words, the overcoat layer is colorless. This will ensure the visibility of the palladium layer.

Figure 5:
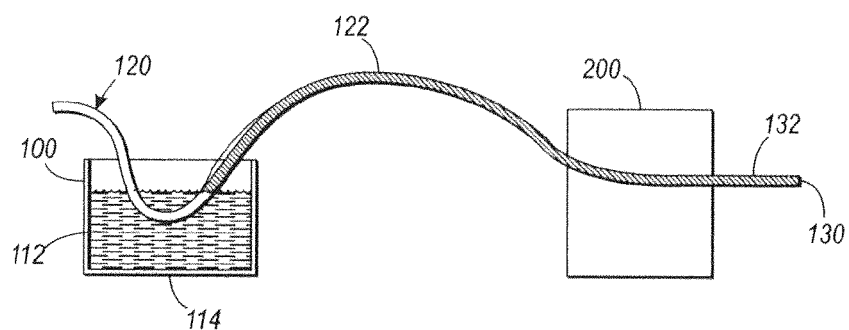
FIG. 5 is a schematic diagram showing the process of coating a wire of the present disclosure.

FIG. 5 is a schematic diagram illustrating the processes described herein. In step 100, a palladium nanoparticle coating solution 112 is presented in a vessel 114. A wire 120 is drawn through the coating solution to form a coating 122 on the wire. Note that this allows for continuous production of the wire. Next in step 200, the coating 122 is annealed by exposure to heat. The result is a wire 130 having a palladium cladding 132. The original wire 120 serves as a substrate upon which the cladding is located.

Figure 6:
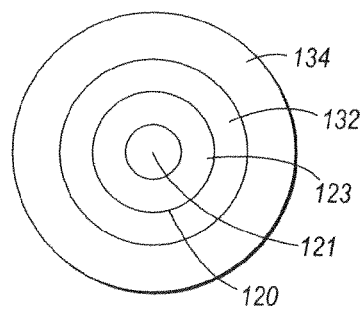
FIG. 6 is a cross-sectional view of a wire having a silver cladding and an overcoat layer atop the silver cladding.

FIG. 6 is a cross-sectional view of the final wire 130. At the center is the original wire 120. As noted above, this original wire 120 may comprise a core 121 and other layers prior to receiving the palladium cladding. For example, the original wire may include a receiving layer 123. Palladium cladding 132 covers the wire 120. An overcoat layer 134 may surround the palladium cladding 132.

It may be desirable to clean the wire prior to drawing the wire through the palladium nanoparticle composition. This can be done by, for example, wiping the wire with isopropanol or using a plasma treatment on the surface of the wire. This will aid in maintaining a uniform coating and ensuring a 100% palladium cladding.

The following examples are for purposes of further illustrating the present disclosure. The examples are merely illustrative and are not intended to limit devices made in accordance with the disclosure to the materials, conditions, or process parameters set forth therein.

EXAMPLES

Palladium acetate (trimer) (1 gram, 4.5 millimoles), octylamine (0.66 grams, 5 millimoles), and decalin (3.5 milliliters, 3.1 grams) were added to a reaction flask (50 milliliters) to form an initial mixture. The initial mixture was stirred at room temperature under nitrogen for 30 minutes. Phenylhydrazine (0.4 grams, 4 millimoles) was added to the initial mixture to form a reaction mixture. The reaction mixture was heated to 40° C. and stirred for 2 hours, further stirred at 30° C. overnight, and then another 3 hours at 40° C. A black-colored palladium nanoparticle ink resulted. The black-colored ink was cooled down to room temperature and diluted with decalin (6 milliliters). The ink was filtrated using a syringe (25 milliliters) with a glass fiber membrane (1 micrometer). The ink was then spin coated onto a glass slide to form a uniformly thin layer of film without crystallization or precipitation. The film was annealed at 180 to 250° C. for about 10 minutes. The film changed from black to a shiny metallic color. The palladium thin film had a thickness of about 85 nm and was measured to be highly conductive by a two probe measurement.

Copper wires were coated with the palladium nanoparticle ink by dipping them into the ink and then slowly removing them. The coated copper wires were then annealed at a temperature of about 200° C. in an oven for about 5 minutes. Shiny metallic white wires were obtained. The uncoated areas of the copper wires exhibited no color changes. The coated thin layer was mechanically robust against rubbing and resistant to washing with solvents such as isopropyl alcohol (IPA), methanol, and toluene.

Figure 7:
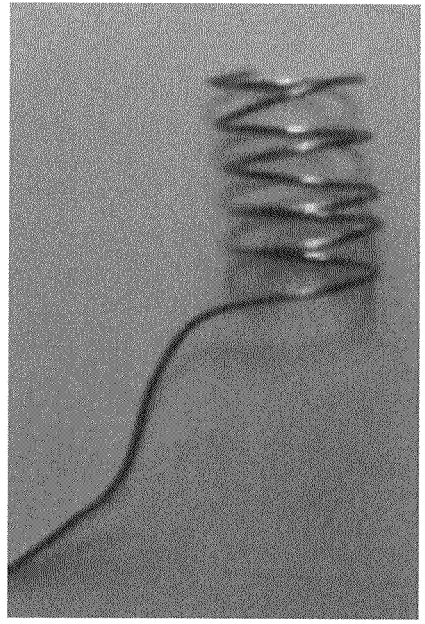
FIG. 7 is a color photograph of a copper spring.
Figure 8:
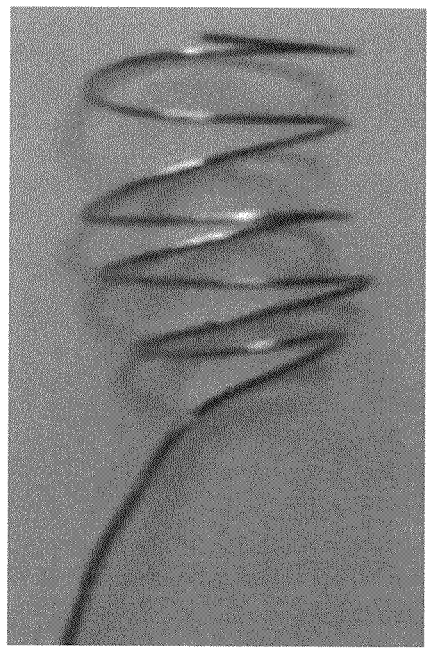
FIG. 8 is a color photograph of a copper spring that has been partially coated with a palladium nanoparticle ink of the present disclosure.

FIG. 7 is a photograph of a copper wire. FIG. 8 is a photograph of a copper wire which has been partially coated with the palladium nanoparticle ink. The coated areas of the wire of FIG. 8 exhibited a color change from a copper color to a silver-like metallic color.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

The invention claimed is:

1. A process for preparing a palladium nanoparticle ink, comprising reacting a reaction mixture comprising a palladium salt, a stabilizer, a reducing agent, and a solvent to directly form the palladium nanoparticle ink;
wherein the molar ratio of the reducing agent to the palladium salt in the reaction mixture is from about 1:1 to about 5:1; and
wherein directly forming the palladium nanoparticle ink occurs without isolation of the palladium nanoparticles from the reaction mixture.

2. The process of claim 1, wherein the palladium salt is selected from the group consisting of palladium carboxylate, palladium acetate, palladium chloride, palladium bromide, palladium iodide, palladium nitrate, palladium sulfate, palladium cyanide, (ethylenediamine)palladium chloride, bis(ethylenediamine)palladium chloride, tetraaminepalladium bromide, tetraaminepalladium bromide monohydrate, tetraaminepalladium chloride, tetraaminepalladium chloride monohydrate, bis(acetylacetonato) palladium, and diamine-dinitro-palladium.

3. The process of claim 1, wherein the stabilizer is an organoamine selected from the group consisting of propylamine, butylamine, pentylamine, hexylamine, heptylamine, octylamine, nonylamine, decylamine, undecylamine, dodecylamine, tridecylamine, tetradecylamine, pentadecylamine, hexadecylamine, heptadecylamine, octadecylamine, N,N-dimethylamine, N,N-dipropylamine, N,N-dibutylamine, N,N-dipentylamine, N,N-dihexylamine, N,N-diheptylamine, N,N-dioctylamine, N,N-dinonylamine, N,N-didecylamine, N,N-diundecylamine, N,N-didodecylamine, methylpropylamine, ethylpropylamine, propylbutylamine, ethylbutylamine, ethylpentylamine, propylpentylamine, butylpentylamine, triethylamine, tripropylamine, tributylamine, tripentylamine, trihexylamine, triheptylamine, trioctylamine, 1,2-ethylenediamine, N,N,N',N'-tetramethylethylenediamine, propane-1,3-diamine, N,N,N',N'-tetramethylpropane-1,3-diamine, butane-1,4-diamine, and N,N,N',N'-tetramethylbutane-1,4-diamine, or a mixture thereof.

4. The process of claim 1, wherein the solvent is selected from the group consisting of an alkane having from about 8 to about 18 carbon atoms, an alcohol having from about 8 to about 18 carbon atoms, an isoparaffin hydrocarbon, toluene, mesitylene, xylene, ethylbenzene, diethylbenzene, trimethyl benzene, methyl ethylbenzene, tetrahydronaphthalene, benzene, cyclohexane, decalin, chlorobenzene, dichlorobenzene; trichlorobenzene; nitrobenzene; cyanobenzene; and mixtures thereof.

5. The process of claim 1, wherein the reducing agent is a hydrazine compound, a borane compound, or a mixture thereof.

6. The process of claim 5, wherein the reducing agent is a hydrazine compound of the formula:

$R^1R^2N-NR^3R^4$ wherein $R^1$, $R^2$, $R^3$ and $R^4$ are independently selected from hydrogen, alkyl, and aryl.

7. The process of claim 1, wherein the molar ratio of the stabilizer to the palladium salt in the reaction mixture is from about 1:1 to about 10:1.

8. The process of claim 1, wherein the palladium salt is from about 5 to about 80 wt % of the reaction mixture.

9. The process of claim 1, wherein the reaction mixture is reacted at a temperature of from about 20° C. to about 70° C.

10. The process of claim 1, wherein palladium nanoparticles are from about 5 to about 80 wt % of the palladium nanoparticle ink.

11. A process for preparing a palladium nanoparticle ink, comprising:
preparing an initial mixture comprising a palladium salt, a stabilizer, and solvent;
adding a reducing agent to the initial mixture to form a reaction mixture, and the molar ratio of the reducing agent to the palladium salt in the reaction mixture is from about 1:1 to about 5:1;
mixing the reaction mixture to reduce at least a portion of the palladium salt to directly obtain the palladium nanoparticle ink without isolation of the palladium nanoparticles from the reaction mixture; and
optionally diluting the ink by adding additional solvent.

12. The process of claim 11, wherein the stabilizer is an organoamine.

13. The process of claim 11, wherein the reducing agent is an organohydrazine.

14. The process of claim 11, wherein the solvent is a hydrocarbon solvent.

15. The process of claim 11, wherein the molar ratio of the stabilizer to the palladium salt in the reaction mixture is from about 1:1 to about 10:1.

* * * * *